United States Patent
Redecker (10) Patent No.: US 7,402,343 B2
(45) Date of Patent: Jul. 22, 2008

(54) MOLECULAR CHEMICAL COMPOUNDS WITH STRUCTURES ALLOWING ELECTRON DISPLACEMENT AND CAPABLE OF EMITTING PHOTOLUMINESCENT RADIATION, AND PHOTOLUMINESCENCE QUENCHING DEVICE EMPLOYING THE SAME

(75) Inventor: Michael Redecker, Berlin (DE)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 502 days.

(21) Appl. No.: 10/727,642

(22) Filed: Dec. 5, 2003

(65) Prior Publication Data

US 2004/0147701 A1 Jul. 29, 2004

(30) Foreign Application Priority Data

Jan. 29, 2003 (EP) .................................. 03090022
Aug. 27, 2003 (KR) ...................... 10-2003-0059486

(51) Int. Cl.
*H01J 1/64* (2006.01)
*C09K 11/06* (2006.01)

(52) U.S. Cl. ........................ 428/690; 428/917; 313/504; 313/506; 528/4

(58) Field of Classification Search ............... 528/4; 428/690, 917; 313/504, 506; 257/40, 500, 257/E51.032, E51.031
See application file for complete search history.

(56) References Cited

U.S. PATENT DOCUMENTS

| 5,093,210 A | 3/1992 | Ohta et al. ................... 428/690 |
| 5,745,629 A | 4/1998 | Sasaki .......................... 385/122 |
| 5,814,244 A | 9/1998 | Kreuder ................. 252/301.16 |
| 6,180,217 B1 | 1/2001 | Ueda et al. ................... 428/212 |
| 6,288,206 B1 | 9/2001 | Stewart et al. .............. 528/201 |
| 6,337,167 B1* | 1/2002 | Ichimura et al. .............. 430/73 |
| 6,406,804 B1* | 6/2002 | Higashi et al. .............. 428/690 |
| 2002/0136924 A1* | 9/2002 | Higashi et al. .............. 428/690 |
| 2004/0263045 A1* | 12/2004 | Smith et al. ................. 313/373 |

FOREIGN PATENT DOCUMENTS

| EP | 0 866 110 A1 | 9/1996 |
| EP | 0 891 121 A1 | 1/1999 |
| EP | 1 061 112 A1 | 12/2000 |

(Continued)

OTHER PUBLICATIONS

Synthesis and Device Characterisation of Side-Chain Polymer Electron Transport Materials for Organic Semiconductor Applications, by Dailey et al., *Journal of Materials Chemistry*; XP-002271343; published on web Aug. 2, 2001.

(Continued)

*Primary Examiner*—Milton I. Cano
*Assistant Examiner*—Camie S. Thompson
(74) *Attorney, Agent, or Firm*—Robert E. Bushnell, Esq.

(57) ABSTRACT

A chemical compound which has an electron donor group, an electron acceptor group, and a conjugated bridging element bridging between the electron donor group and the electron acceptor group. The chemical compound has a readily displaceable electron, is capable of emitting photoluminescent radiation. A dipole character is present therein only in the excited state of the compound. The compounds are suitable for use in optical devices and, particularly, can be used for photoluminescence quenching devices.

14 Claims, 1 Drawing Sheet

FOREIGN PATENT DOCUMENTS

| | | | |
|---|---|---|---|
| EP | 1 195 422 | | 4/2002 |
| JP | 03-075785 | | 3/1991 |
| JP | 04-240654 | | 8/1992 |
| JP | 05-281761 | * | 10/1993 |
| JP | 10-161329 | * | 6/1998 |
| WO | WO 97/40648 | | 10/1997 |
| WO | WO 02/092723 A1 | | 11/2002 |

OTHER PUBLICATIONS

A Novel Emitting Polymer With Bipolar Carrier Transporting Abilities, by Wang et al., *Journal of Applied Polymer Science*; XP-002271344; accpeted Jul. 30, 2002.

Electroluminescence of 1,3,4-Oxadiazole and Triphenylamine-Containing Molecules as an Emitter in Organic Multilayer Light Emitting Diodes, by Tamoto et al., *Chemical Materias*; 1997; XP-002271345.

Improved Efficiencies of Light-Emitting Diodes Through Incorporation of Charge Transporting Components in Tri-Block Polymers, by Chen et al., *Synthetic Metals*; 1999; XP-002271346.

*Office action* from the Japanese Patent Office issued in Applicant's corresponding Japanese Patent Application No. 2004-007343 dated Nov. 13, 2007.

* cited by examiner

# MOLECULAR CHEMICAL COMPOUNDS WITH STRUCTURES ALLOWING ELECTRON DISPLACEMENT AND CAPABLE OF EMITTING PHOTOLUMINESCENT RADIATION, AND PHOTOLUMINESCENCE QUENCHING DEVICE EMPLOYING THE SAME

CLAIM OF PRIORITY

This application makes reference to, incorporates the same herein, and claims all benefits accruing under 35 U.S.C. §119 from an application for MOLECULAR CHEMICAL COMPOUNDS WITH STRUCTURES ALLOWING ELECTRON DISPLACEMENT AND CAPABLE OF EMITTING PHOTOLUMINESCENT RADIATION, AND PHOTOLUMINESCENCE QUENCHING DEVICE EMPLOYING THE SAME earlier filed in the European Patent Office on 29 Jan. 2003 and there duly assigned Ser. No. 03 090 022.9, and earlier filed in the Korean Intellectual Property Office on 27 Aug. 2003 and there duly assigned Ser. No. 2003-59486.

BACKGROUND OF THE INVENTION

1. Field of the Invention

The invention relates to molecular chemical compounds for optical devices, which have structures allowing electron displacement and capable of emitting photoluminescent radiation, and photoluminescence quenching devices (display devices) employing the same.

2. Description of the Related Art

Chemical compounds possessing the property of absorbing high-energy radiation (UV radiation, X-ray radiation, cathode radiation, etc.) and transforming the same into longer-wave, normally visible, radiation are referred to as luminophores. The process is called luminescence. Luminescence processes can be classified as to the type of energy supply. For example, in photoluminescence, an electron is promoted to a higher energy level by optical excitation (irradiation), whereas, in electroluminescence, an electron is promoted to a higher energy level by applying an electric field.

Photoluminescence quenching devices (PQDs) are known as a display device applying photoluminescence technology used under outdoor conditions, e.g., in strong sunlight. The photoluminescence quenching devices use exterior light to generate photoluminescent light which can be modulated by means of an applied voltage. These display devices can be operated in an auto-emissive mode which can be utilized under conditions where exterior light is sparse or absent.

The basic principle of the photoluminescence quenching device is well known. It involves a mechanism wherein splitting of the excited state permits controlling the intensity of emitted light. Such splitting produces charge carriers which are removed via the contacts. Hence, the mechanism of the photoluminescence quenching device proceeds inversely to that of an organic light-emitting diode (OLED) wherein charge carriers undergo recombination with emission of light.

Conjugated polymers selected from materials having a poly(phenylenevinylene) (PPV) or polyfluorene (PFO) basic structure are presently used as materials in PQDs. However, these materials have been developed for use in polymer organic light-emitting diodes (PLEDS) and show fluorescence quenching of more than 70% only at relatively high electric fields of $2.5 \times 10^8$ V/m when used in PQD devices.

Donor-acceptor structures having non-linear optical properties were disclosed. Chiral materials for non-linear optical uses were disclosed by Stewart et al. in U.S. Pat. No. 6,288,206B1 and polymers for non-linear optical uses were disclosed by Sasaki in U.S. Pat. No. 5,745,629A. However, emission of photoluminescent radiation is of secondary importance in these patents because the field dependence of the absorption and, in particular, that of the refractive index are to be utilized with priority. The compounds which exhibit very strong donor-acceptor interactions even in the ground state of the material are not appropriate for photoluminescence quenching devices because these compounds are non-emissive due to high polarity.

SUMMARY OF THE INVENTION

It is therefore an object of the present invention to provide an improved material for a photoluminescence quenching device and an improved photoluminescence quenching device using the material.

It is another object of the present invention to provide chemical compounds enabling amplification of coupling between the electric field and the excited state.

It is a further object to provide for chemical compounds which allow for modulation of photoluminescent light by means of an electric field in a photoluminescence quenching device (PQD) and provide high photoluminescence quantum yields while ensuring high fluorescence quenching, lowering the electric field required for photoluminescence quenching, and exhibiting luminescent properties.

The present invention may be constructed with chemical compounds having a system including readily displaceable electrons which, in their excited states, furnish a desired dipole. The structure of the chemical compound includes an electron-rich donor group (electron donor group), an electron-deficient acceptor group (electron acceptor group), and a conjugated bridging element which bridges between the electron donor group and the electron acceptor group.

The chemical compounds of the present invention are designed in such a fashion that no significant dipole moment is produced by their donor/acceptor character in the ground state, but only develops in the excited state.

Preferably, the electron donor group is an aromatic amine or a fused cyclic system. More preferably, the electron donor group is triphenylamine, phenylenediamine, benzidine, carbazole, thiophene, and oligomers thereof.

The conjugated bridging element includes a π-conjugated carbon bond which is preferably included in an organic polymer with a chemical basic structure selected from the group consisting of a phenylenevinylene moiety in the form of a monomer, an oligomer, a polymer and a substituted product thereof, a phenylene moiety in the form of a monomer, an oligomer, a polymer and a substituted product thereof, a fluorene moiety in the form of a monomer, an oligomer, a polymer and a substituted product thereof, a vinylene moiety in the form of a monomer, an oligomer, a polymer and a substituted product thereof, a ethinylene moiety in the form of a monomer, an oligomer, a polymer and a substituted product thereof, an anthranylene moiety in the form of a monomer, an oligomer, a polymer and a substituted product thereof, and a naphthylene moiety in the form of a monomer, an oligomer, a polymer and a substituted product thereof.

The electron acceptor group preferably includes monosubstituted phenyl, disubstituted phenyl, trisubstituted phenyl, imide and anhydride of aromatic polycarboxylic acid, oxazole, and a fused cyclic system. More preferably, the electron acceptor group has a chemical basic structure selected from the group consisting of fluorine-substituted phenyl, nitro-substituted phenyl, cyano-substituted phenyl, imide and anhydride of perylenetetracarboxylic acid and a substituted compound thereof, imide and anhydride of naphthalenetetracarboxylic acid and a substituted compound thereof, oxadiazole and a substituted compound thereof, oxazole and a substituted compound thereof, and a fluorenylidene moiety and a substituted compound thereof.

The above chemical compounds can be used for a photoluminescence quenching device. The preferred embodiment of the photoluminescence quenching device includes a glass substrate, a conductive transparent indium-tin oxide (ITO) layer on the glass substrate, a poly(ethylenedioxythiophene)/polystyrenesulfonic acid conductive polymer layer with a thickness of about 30 to about 100 nm on the conductive transparent indium-tin-oxide layer, an emitter layer comprising the chemical compounds having the donor-acceptor structure with a thickness of from 50 to 150 nm, and a metal contact. More than half of the emitted photoluminescent radiation may be suppressed when applying a voltage of 15 volts.

BRIEF DESCRIPTION OF THE DRAWINGS

The above aspect and advantages of the present invention will become more apparent by describing in detail preferred embodiments thereof with reference to the attached drawings in which.

DETAILED DESCRIPTION OF THE INVENTION

Owing to the structure of a donor/conjugated bridging element/acceptor, the compound of the present invention is particularly suitable for use in a photoluminescence quenching device (PQD). Stronger coupling is achieved by higher bulkiness and a more dipolar character in the excited state. In the excited state, the applied exterior electric field can act on the dipole and give rise to charge separation.

Figure 1:
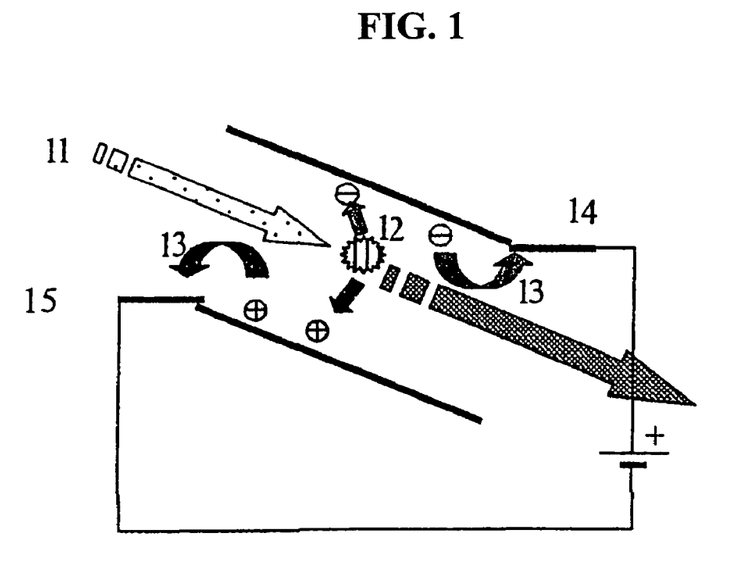
FIG. 1 is a diagram illustrating a functional principle of a photoluminescence quenching device according to the present invention.

The basic principle of the PQD is illustrated in FIG. 1. In analogy to an OLED display, the design of a PQD is likewise very simple, in principle. The (extremely thin) molecular chemical layer is embedded between two metal films. Excited states are generated in the material by absorption of ambient light and may undergo radiative decay with emission of light. An electric field is created by applying a voltage to the two contacts. The electric field effects separation of the excited states into charge carriers which are removed via the contacts.

To avoid corrosion and chemical degradation, the entire structure is set up in an inert gas atmosphere and encapsulated so as to be airtight. The better the sealing, the longer the expected service life of the device.

Figure 2:
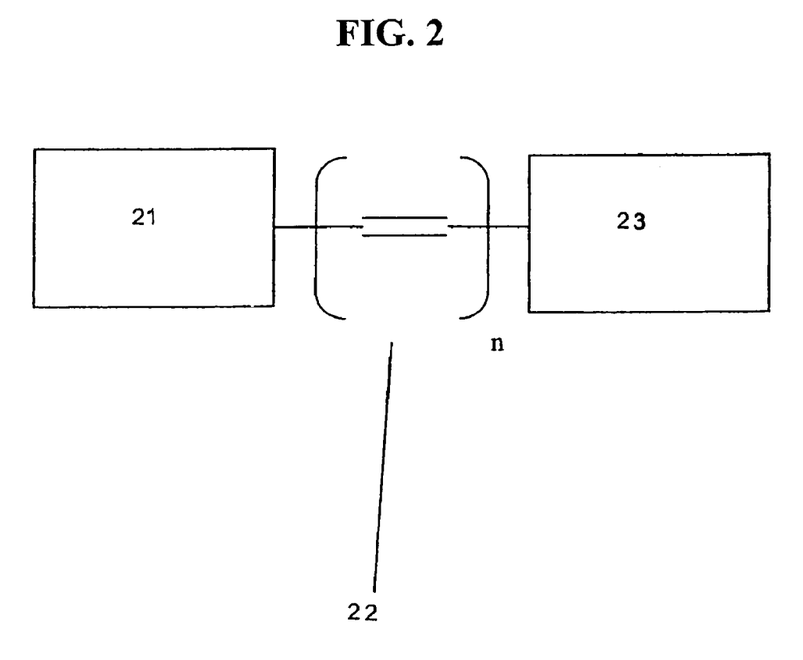
FIG. 2 illustrates a basic configuration of a donor-acceptor structure according to the present invention.

The structural set-up principle of the donor/conjugated bridging element/acceptor molecular chemical layer is illustrated in FIG. 2.

The preparation of the compounds according to the present invention is effected according to methods well-known to those skilled in the art. Thus, for example, the individual structural elements can be joined together using well-known modular systems. To this end, both oligomers or monomers and polymer structures can be created. Thin monomer and oligomer layers can be produced by vapor deposition in high vacuum. To this end, appropriate materials are evaporated in high vacuum from a heatable evaporation source and deposited as a compact thin film on substrates situated in a high vacuum. Typical basic pressures are in the range of from $10^{-4}$ to $10^{-9}$ mbars.

According to the invention, the chemical basic structures for such an electron donor group preferably are aromatic amines and fused cyclic systems. Preferably, the electron donor group includes (a) triphenylamine, (b) phenylenediamine or p-semidine (aminodiphenylamine) and (c) benzidine, (d) carbazole (dibenzopyrrole) and (e) thiophene and its oligomers. The compounds having a basic structure of triphenylamine of formula 1a, phenylenediamine of formula 1b, benzidine of formula 1c, carbazole of formula 1d, and thiophene and its oligomers, represent classes of structures particularly suitable for the donor portion.

[Formula 1a]

[Formula 1b]

[Formula 1c]

[Formula 1d]

The conjugated bridging elements according to the present invention are preferably selected from the substance group of π-conjugated organic compounds.

More specifically, the compounds are selected from (a) phenylenevinylene moieties in the form of monomers, oligomers, polymers and substituted products thereof, (b) phenylene moieties in the form of monomers, oligomers, polymers and substituted products thereof, (c) fluorene moieties in the form of monomers, oligomers, polymers and substituted products thereof, (d) vinylene moieties in the form of monomers, oligomers, polymers and substituted products thereof, (e) ethinylene moieties in the form of monomers, oligomers, polymers and substituted products thereof, (f) anthranylene moieties in the form of monomers, oligomers, polymers and substituted products thereof, and (g) naphthylene moieties in the form of monomers, oligomers, polymers and substituted products thereof.

Especially suitable structural classes for a conjugated bridging element are the compounds including (a) phenylenevinylene moieties of formula 2a in the form of monomers, oligomers, polymers and substituted products thereof, (b) phenylene moieties of formula 2b in the form of monomers, oligomers, polymers and substituted products thereof, (c) fluorene moieties of formula 2c in the form of monomers, oligomers, polymers and substituted products thereof, (d) vinylene moieties of formula 2d in the form of monomers, oligomers, polymers and substituted products thereof, (e) ethinylene moieties of formula 2e in the form of monomers, oligomers, polymers and substituted products thereof, (f) anthranylene moieties of formula 2f in the form of monomers, oligomers, polymers and substituted products thereof, and (g) naphthylene moieties of formula 2g in the form of monomers, oligomers, polymers and substituted products thereof.

[Formula 2a]

wherein n is a number ranging from 1 to 20.

[Formula 2b]

wherein n is a number ranging from 1 to 20.

[Formula 2c]

wherein n is a number ranging from 1 to 20.

[Formula 2d]

wherein n is a number ranging from 1 to 20.

[Formula 2e]

wherein n is a number ranging from 1 to 20.

[Formula 2f]

wherein n is a number ranging from 1 to 20.

[Formula 2g]

wherein n is a number ranging from 1 to 20.

In the formulae above and below, an asterisk '*' indicate the point of attachment of an electron donor or an electron acceptor.

Preferred chemical basic structures for electron acceptor compounds are mono-, di- and/or trisubstituted phenyls, imides and anhydrides of aromatic polycarboxylic acids, oxazoles, as well as fused cyclic systems.

Preferably, they are (a) fluorine-substituted phenyl groups (mono-, di- and/or tri-substituted); (b) nitro-substituted phenyl groups, preferably m- and p-substituted phenyl groups; (c) cyano-substituted phenyl groups, preferably mono- or disubstituted phenyl groups; (d) imides and anhydrides of perylenetetracarboxylic acid, and substituted products thereof; (e) imides and anhydrides of naphthalenetetracarboxylic acid, and substituted products thereof; (f) oxadiazoles, and substituted products thereof; (g) oxazoles, and substituted products thereof; and (h) fluorenylidene moieties, and substituted products thereof.

Especially suitable compounds of the electron acceptor groups include fluorine-substituted phenyl groups of formulae 3a-3c, nitro-substituted phenyl groups of formulae 3d and 3e, cyano-substituted phenyl groups of formulae 3f-3h, imides and anhydrides of perylenetetracarboxylic acid of formula 3i, imides and anhydrides of naphthalenetetracarboxylic acid of formula 3j, oxadiazoles of formula 3k and substituted products thereof, oxazoles of formula 3l and substituted products thereof, and fluorenylidene moieties of formula 3m and substituted products thereof.

[Formula 3a]

-continued

[Formula 3b]

[Formula 3c]

[Formula 3d]

[Formula 3e]

[Formula 3f]

[Formula 3g]

[Formula 3h]

-continued

[Formula 3i]

[Formula 3j]

[Formula 3k]

[Formula 3l]

[Formula 3m]

More preferred chemical compounds with structures allowing electron displacement, capable of emitting photoluminescent radiation, are donor/bridge/acceptor structures in the form of oligomers and monomers of formulas 4a through 4c, as well as compounds including triphenylamine-oxadiazole combination of formula 5a having a donor and an acceptor in the main chain of the polymer, phenylenediamine-trifluorobenzene combination of formula 5b having a donor and an acceptor in the main chain of the polymer, and benzi- dine-bis(oxadiazole) combination of formula 5c having a donor in the main chain and an acceptor in the side chain.

A non-symmetrical triphenylamine-oxadiazole combination of formula 4a, a non-symmetrical phenylenediamine-trifluorobenzene combination and a symmetrical phenylenediamine-bis(trifluorobenzene) combination have typical structures of donor-acceptor materials based on small molecules.

[Formula 4a]

[Formula 4b]

[Formula 4c]

[Formula 5a]

wherein n is a number ranging from 100 to 2,000.

[Formula 5b]

wherein n is a number ranging from 100 to 2,000.

In another embodiment of the invention, the conjugated bridging element according to the invention has an additional branched or side chain and a substitution incorporated therein to improve the solubility. It is preferred to use branched alkyl and alkoxy groups preferably with four to fourteen carbon atoms. The electron donor and acceptor groups may be linked to the main chain of the bridging element, may be linked to the branched or side chain of the bridging element or may be linked as a branched or side chain of the bridging element.

The compounds provided according to the invention are excellently suited for use in photoluminescence quenching devices. They have luminescent properties, ensure high fluorescence quenching, require the electric filed of lower than $1.5 \times 10^8$ V/m to quench half of the photoluminescent radiation emitted with no field, and, in addition, furnish high photoluminescence quantum yields. Typical fluorescence quantum yields are at values higher than 40%. Materials of the invention having the structures of formula 5a, 5b and 5c are found to be particularly suitable.

A photoluminescence quenching device (PQD) according to the invention, using a polymer emitter material integrated as a thin film in the PQD display device, has the following structure.

[Formula 5c]

wherein n is a number ranging from 100 to 2,000.

The display device is set up based on a transparent substrate, preferably a glass substrate coated with conductive transparent indium-tin oxide (ITO).

The ITO layer is spin-coated with a layer of poly(ethylenedioxythiophene)/polystyrenesulfonic acid conductive polymer. This layer serves to level any surface roughness. The preferred typical layer thickness ranges from 30 to 100 nanometers.

The polymers of the invention are processed into thin films by spin-coating from a suitable organic solvent such as toluene, xylene, chloroform, or chlorobenzene. Subsequently, a layer of emitter polymer in accordance with formula 5(a), 5(b) or 5(c) is spin-coated to a typical thickness of 50-150 nanometers.

The structure is completed by depositing a metal contact under high vacuum. The metals are selected from aluminum, calcium, ytterbium, silver, titanium, magnesium, zinc, and indium. It is also possible to use combinations of these metals and thin insulating layers made of fluorides and oxides of alkaline and alkaline earth metals.

Lithium fluoride with a thickness of one nanometer, deposited by thermal vapor deposition under high vacuum, is preferably used to this end. Onto this layer, preferably an aluminum layer with a typical thickness of 50-200 nanometers is coated by vapor deposition. The structure is completed by an encapsulation, preferably glass, which is sealed with an adhesive so as to be gas-tight.

The structure emits photoluminescent radiation when irradiated with sunlight. The intensity of photoluminescence can be decreased by applying a voltage between the metal contact and ITO contact. The metal contact has positive polarity with respect to the ITO contact. When applying a voltage of 15 volts, more than half of the emitted photoluminescent radiation will be suppressed.

The compounds according to the invention are capable of readily displacing electrons, exhibit dipole character only in an excited state, and comprise chemical structures which represent electron donor/electron acceptor structures linked to each other via a conjugated bridging element. Since the compounds exhibit emissive properties, high photoluminescence quenching efficiency, and provide high photoluminescence quantum yields, the compounds are particularly suitable for use in photoluminescence quenching devices.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A photoluminescence quenching device comprising a chemical compound, comprising:
   an electron donor group at one end of the chemical compound, the electron donor group is selected from the group consisting of carbazole, thiophene, compounds of formulas 1a through 1d, thiophene, and oligomers thereof:

[Formula 1a]

[Formula 1b]

[Formula 1c]

[Formula 1d]

an electron acceptor group at the other end of the chemical compound, the electron acceptor group selected from the group consisting of monosubstituted phenyl, disubstituted phenyl, trisubstituted phenyl, imide and anhydride of aromatic polycarboxylic acid, oxazole, a fused cyclic system, a compound having a chemical basic structure selected from the group consisting of a fluorine-substituted phenyl group, a nitro-substituted phenyl group, a cyano-substituted phenyl group, imide and anhydride of perylenetetracarboxylic acid and a substituted compound thereof, imide and anhydride of naphthalenetetracarboxylic acid and a substituted compound thereof, oxadiazole and a substituted compound thereof, oxazole and a substituted compound thereof, and a fluorenylidene moiety and a substituted compound thereof, and the following compounds of formulas 3a through 3m;

[Formula 3a]

-continued

,

,

,

,

,

,

,

[Formula 3b]

[Formula 3c]

[Formula 3d]

[Formula 3e]

[Formula 3f]

[Formula 3g]

[Formula 3h]

-continued

[Formula 3i]

,

[Formula 3j]

,

[Formula 3k]

,

[Formula 3l]

, and

[Formula 3m]

; and a conjugated bridging element, said electron donor group and said electron acceptor group linked to each other via said conjugated bridging element,
wherein said chemical compound has a readily displaceable electron, a dipole character is present only in the excited state, and said chemical compound is capable of emitting photoluminescent radiation, and the photoluminescent quenching device generates photoluminescent light by using exterior light and is capable of auto-emitting photoluminescent light when light is sparse or absent.

2. The photoluminescence quenching device according to claim 1, wherein the conjugated bridging element has a π-conjugated carbon bond.

3. The photoluminescence quenching device according to claim 2, wherein the π-conjugated carbon bond is included in an organic polymer with a chemical basic structure selected from the group consisting of a phenylenevinylene moiety in the form of a monomer, an oligomer, a polymer and a substituted product thereof, a phenylene moiety in the form of a monomer, an oligomer, a polymer and a substituted product thereof, a fluorene moiety in the form of a monomer, an oligomer, a polymer and a substituted product thereof, a vinylene moiety in the form of a monomer, an oligomer, a polymer and a substituted product thereof, an ethynylene moiety in the form of a monomer, an oligomer, a polymer and a substituted product thereof, an anthranylene moiety in the form of a monomer, an oligomer, a polymer and a substituted product thereof, a naphthylene moiety in the form of a monomer, an oligomer, a polymer and a substituted product thereof.

4. The photoluminescence quenching device according to claim 2, wherein the conjugated bridging element is selected from the group consisting of formulas 2a through 2g:

[Formula 2a]

wherein n is a number ranging from 1 to 20,

[Formula 2b]

wherein n is a number ranging from 1 to 20,

[Formula 2c]

wherein n is a number ranging from 1 to 20,

[Formula 2d]

wherein n is a number ranging from 1 to 20,

[Formula 2e]

wherein n is a number ranging from 1 to 20,

[Formula 2f]

wherein n is a number ranging from 1 to 20, and

[Formula 2g]

wherein n is a number ranging from 1 to 20.

5. The photoluminescence quenching device according to claim 1, wherein the electron donor group is an aromatic amine or a fused cyclic system, the conjugated bridging element has a K-conjugated carbon bond, and the electron acceptor group is selected from the group consisting of mono-substituted phenyl, disubstituted phenyl, trisubstituted phenyl, imide and anhydride of aromatic polycarboxylic acid, oxazole, and a fused cyclic system.

6. The photoluminescence quenching device according to claim 1, wherein an required electric filed to quench half of photoluminescent radiation emitted without an electric field is less than $1.5 \times 10^8$ V/m.

7. The photoluminescence quenching device according to claim 1, wherein the electron donor group is an aromatic amine or a fused cyclic system.

8. The photoluminescence quenching device according to claim 1, wherein the electron donor group is selected from the group consisting of triphenylamine, phenylenediamine and benzidine.

9. A photoluminescence quenching device, comprising:
a glass substrate;
a layer of conductive transparent indium-tin oxide (ITO) on said glass substrate;
a layer of poly(ethylenedioxythiophene)/polystyrene-sulfonic acid conductive polymer with a layer thickness of from 30 to 100 nm on said layer of conductive transparent indium-tin-oxide;
an emitter polymer layer having a thickness of from 50 to 150 nm, said emitter polymer layer having a material selected from the group consisting of the following compounds of formula 5a through 5c:

[Formula 5a]

wherein n is a number ranging from 100 to 2,000,

[Formula 5b]

wherein n is a number ranging from 100 to 2,000, and wherein n is a number ranging from 100 to 2,000;
a metal contact; and
an aluminum layer with a layer thickness of from 50 to 200 nm.

10. The photoluminescence quenching device according to claim 9, further comprising an insulating film between the metal contact and the aluminum layer.

11. The photoluminescence quenching device according to claim 9, wherein more than half of photoluminescent radiation is suppressed when applying a voltage of 15 volts.

12. A photoluminescence quenching device, comprising:
two metal films; and
a chemical layer embedded between the two metal films, the chemical layer comprised of a compound having:
an electron donor group at one end of the compound, the electron donor group is selected from the group consisting of carbazole, thiophene, compounds of formulas 1a through 1d, thiophene, and oligomers thereof:

[Formula 1a]

[Formula 1b]

[Formula 1c]

and

-continued

[Formula 1d]

an electron acceptor group at the other end of the compound, the electron acceptor group selected from the group consisting of monosubstituted phenyl, disubstituted phenyl, trisubstituted phenyl, imide and anhydride of aromatic polycarboxylic acid, oxazole, a fused cyclic system, a compound having a chemical basic structure selected from the group consisting of a fluorine-substituted phenyl group, a nitro-substituted phenyl group, a cyano-substituted phenyl group, imide and anhydride of perylenetetracarboxylic acid and a substituted compound thereof, imide and anhydride of naphthalenetetracarboxylic acid and a substituted compound thereof, oxadiazole and a substituted compound thereof, oxazole and a substituted compound thereof, and a fluorenylidene moiety and a substituted compound thereof, and the following compounds of formulas 3a through 3m:

[Formula 3a]

-continued

[Formula 3b]

[Formula 3c]

[Formula 3d]

[Formula 3e]

[Formula 3f]

[Formula 3g]

[Formula 3h]

[Formula 3i]

[Formula 3j]

[Formula 3k]

[Formula 3l], and

[Formula 3m]; and a conjugated bridging element, said electron donor group and said electron acceptor group linked to each other via said conjugated bridging element,
said compound having a readily displaceable electron, a dipole character being present only in the excited state, said compound being capable of emitting photoluminescent radiation, wherein the photoluminescent quenching device generates photoluminescent light by using exterior light and is capable of auto-emitting photoluminescent light when light is sparse or absent.

13. A compound, selected from the group consisting of the following compounds of formulas 4a through 4c:

[Formula 4a]

[Formula 4b]

[Formula 4c]

14. A compound, selected from the group consisting of the following compounds of formula 5a through 5c:

[Formula 5a]

wherein n is a number ranging from 100 to 2,000,

[Formula 5b]

wherein n is a number ranging from 100 to 2,000, and

[Formula 5c]

wherein n is a number ranging from 100 to 2,000.

* * * * *